US010225019B2

United States Patent
Kim et al.

(10) Patent No.: US 10,225,019 B2
(45) Date of Patent: Mar. 5, 2019

(54) DIGITAL SIGNAL TRANSMITTING APPARATUS FOR ADJUSTING MULTI-CHANNEL SUPERCONDUCTING QUANTUM INTERFERENCE DEVICE

(71) Applicant: Korea Research Institute of Standards and Science, Daejeon (KR)

(72) Inventors: Jin Mok Kim, Daejeon (KR); YongHo Lee, Daejeon (KR); Hyukchan Kwon, Daejeon (KR); Ki Woong Kim, Daejeon (KR); KwonKyu Yu, Daejeon (KR)

(73) Assignee: KOREA RESEARCH INSTITUTE OF STANDARD AND SCIENCE, Daejeon (KR)

( * ) Notice: Subject to any disclaimer, the term of this patent is extended or adjusted under 35 U.S.C. 154(b) by 178 days.

(21) Appl. No.: 14/648,987

(22) PCT Filed: Nov. 29, 2013

(86) PCT No.: PCT/KR2013/010989
§ 371 (c)(1),
(2) Date: Jun. 2, 2015

(87) PCT Pub. No.: WO2014/088265
PCT Pub. Date: Jun. 12, 2014

(65) Prior Publication Data
US 2015/0304048 A1     Oct. 22, 2015

(30) Foreign Application Priority Data

Dec. 3, 2012   (KR) ........................ 10-2012-0139105

(51) Int. Cl.
*H04B 10/508*  (2013.01)
*H04B 10/69*   (2013.01)
(Continued)

(52) U.S. Cl.
CPC ....... *H04B 10/508* (2013.01); *G01R 33/0354* (2013.01); *H03M 9/00* (2013.01);
(Continued)

(58) Field of Classification Search
CPC ...... H04B 10/508; H04B 10/60; H04B 10/50; H04B 10/69
(Continued)

(56) References Cited

U.S. PATENT DOCUMENTS

2003/0195645 A1* 10/2003 Pillay ................. H04L 25/4904
700/94
2004/0091073 A1*  5/2004 Smith .................. H04L 7/0331
375/355
(Continued)

FOREIGN PATENT DOCUMENTS

JP    2007044018    2/2002
JP    2007266736    10/2007
(Continued)

OTHER PUBLICATIONS

International Search Report for PCT/KR2013/010989 dated Feb. 24, 2014.

*Primary Examiner* — Sam K Ahn
*Assistant Examiner* — Sarah Hassan
(74) *Attorney, Agent, or Firm* — McAndrews, Held & Malloy, Ltd.

(57) ABSTRACT

A digital adjusting signal for adjusting a multi-channel SQUID system is transmitted only to a control circuit module including a SQUID channel selected in an embodiment of the present invention and not transmitted to other modules. Accordingly, the digital adjusting signal is prevented from flowing into all SQUID adjusting channels to
(Continued)

minimize noise generated by the digital adjusting circuit of the SQUID channel and to stably control the SQUID sensor without malfunction.

10 Claims, 7 Drawing Sheets

(51) Int. Cl.
    *G01R 33/035*    (2006.01)
    *H04B 10/60*    (2013.01)
    *H04B 10/70*    (2013.01)
    *H04Q 11/00*    (2006.01)
    *H03M 9/00*    (2006.01)
    *H04Q 9/00*    (2006.01)

(52) U.S. Cl.
    CPC ............. *H04B 10/60* (2013.01); *H04B 10/69* (2013.01); *H04B 10/70* (2013.01); *H04Q 9/00* (2013.01); *H04Q 11/0005* (2013.01)

(58) Field of Classification Search
    USPC .......................................... 375/222; 370/345
    See application file for complete search history.

(56) References Cited

U.S. PATENT DOCUMENTS

| | | | | |
|---|---|---|---|---|
| 2005/0034009 | A1* | 2/2005 | Sutardja | G06F 13/405 713/503 |
| 2009/0284633 | A1* | 11/2009 | Sakane | H04N 5/335 348/308 |
| 2009/0303385 | A1* | 12/2009 | Yamashita | H04N 7/015 348/500 |
| 2009/0312668 | A1* | 12/2009 | Leuthardt | G06F 19/3456 600/558 |
| 2011/0116646 | A1* | 5/2011 | Sander | H04R 1/1083 381/71.6 |

FOREIGN PATENT DOCUMENTS

| | | |
|---|---|---|
| JP | 2009296438 | 12/2009 |
| WO | WO 01-43441 | 6/2001 |

* cited by examiner

Timing Diagram

DIGITAL SIGNAL TRANSMITTING APPARATUS FOR ADJUSTING MULTI-CHANNEL SUPERCONDUCTING QUANTUM INTERFERENCE DEVICE

CROSS-REFERENCE TO RELATED APPLICATIONS

This application is a 371 of International Patent Application No. PCT/KR2013/010989, filed on Nov. 29, 2013, entitled "DIGITAL SIGNAL TRANSMITTING APPARATUS FOR ADJUSTING MULTI-CHANNEL SUPERCONDUCTING QUANTUM INTERFERENCE DEVICE", which claims priority to Korean Patent Application No. 10-2012-0139105, filed Dec. 3, 2012, entitled "DIGITAL SIGNAL TRANSMITTING APPARATUS FOR CONTROLLING MULTICHANNEL SUPERCONDUCTING QUANTUM INFERENCE DEVICE". The entire contents of the above-identified applications are hereby incorporated by reference.

TECHNICAL FIELD

The present invention relates to a multi-channel voltage output system, and more particularly, to a digital signal transmitting apparatus for adjusting a multi-channel superconducting quantum interference device (SQUID) capable of minimizing or reducing digital noise during an adjusting operation.

BACKGROUND ART

Typically, when a SQUID sensor used for a 160 channel-magnetoencephalography (MEG) system or the like is adjusted, removing noise occurring in a digital signal is a very important issue.

This is because when a spark signal occurring at an edge portion of the digital signal occurs around a SQUID sensor, the SQUID sensor may malfunction due to the spark signal affecting an analog circuit controlling the SQUID sensor as noise. When the SQUID sensor is exposed to an external spark signal, a sensing operation thereof becomes unstable since the SQUID sensor deviates from an optimal operation state or a flux trap phenomenon occurs. In addition, when some of spark flux flow into the SQUID sensor during measurement, accurate measurement is difficult.

DISCLOSURE OF THE INVENTION

Technical Problem

Embodiments of the present invention provide a digital signal transmitting apparatus for adjusting a multi-channel superconducting quantum interference device capable of minimizing or reducing digital noise.

Embodiments of the present invention also provide a digital signal transmitting apparatus capable of more efficiently adjusting a multi-channel device without an effect of noise and a transmitting method according thereto.

Technical Solution

Embodiments of the present invention provide digital signal transmitting apparatuses include:

a serial data receiver; and a module selector receiving a first serial signal through the serial data receiver and transmitting a second serial signal to one module selected from among a plurality of modules installed in the apparatus through a 3-wire serial data line dedicated to a corresponding module.

In some embodiments, the first serial signal may be generated by a computer and applied to the serial data receiver through an optical cable.

In other embodiments, the first serial signal may include module information bits of a set number of bits.

In still other embodiments, the second serial signal may be a serial digital signal that the module information bits are removed.

In even other embodiments, when the apparatus adjusts 160 channels or more, the first and second serial signals may be respectively a 24-bit information serial signal and a 20-bit module information serial signal.

In yet other embodiments, the module selector may include:

a clock extraction unit generating a clock signal from the first serial signal;

a signal generator generating a load signal, reset signal, and chip selection signal by using the clock signal;

a serial-to-parallel converter receiving the clock signal, load signal and reset signal to generate parallel module signals for module selection by converting the module information bits included in the first serial signal;

a selection switch determining one module output terminal selected from among the plurality of module output terminals in response to the parallel module signals; and a data output unit transmitting to a module determined by the selection switch the second serial signal that the module information bits are removed from the first serial signal, a modified clock signal of the clock signal, and a modified chip selection signal of the chip selection signal through the 3-wire serial data line.

In further embodiments, the clock extraction unit may include:

a one shot-pulse generator receiving the first serial signal to generate a one shot-pulse; and a time delay unit delaying the one shot-pulse by a predetermined time to generate the clock signal.

In still further embodiments, the signal generator may include:

a counter counting the clock signal to generate the reset signal;

a load signal generator reset by the reset signal and generating the load signal in response to a first counting output among counting outputs of the counter; and a chip selection signal generator reset by the reset signal and generating the chip selection signal in response to a second counting output among the counting outputs of the counter.

In even further embodiments, the load signal generator may include:

an AND gate receiving the first counting output of the counter as one side input and a feedback signal as another side input to generate an AND response;

a flip-flop latching an output of the AND gate until a reset terminal is reset; and an inverter inverting a logic of the load signal output terminal of the flip-flop to generate the feedback signal.

In yet further embodiments, the serial-to-parallel converter may generate the parallel module signals in 4 bits.

In much further embodiments, the load signal may become a high level signal right after the counter counts a fourth clock signal and a low level signal after the counter counts a 24th clock signal.

In still much further embodiments, the selection switch may be a 1:16 demultiplexer generating a high level signal at one of 16 output terminals in response to the parallel module signals.

In even much further embodiments, the data output unit may include:

a line cross connector connecting the first serial signal and chip selection signal to an output terminal of a module selected by the selection switch; and an AND gating unit gating the first serial signal, clock signal, and chip selection signal as module output information of the selection switch to allow the second serial signal, modified clock signal, and modified chip selection signal to be transmitted through the 3-wire serial data line.

In other embodiments of the present invention, digital signal transmitting apparatuses suitable for being employed in a Magnetoencephalography system having a plurality of channels, includes:

a serial data receiver receiving a first serial signal applied from a control computer; and a module selector connected to the serial data receiver through a signal line, connected to a channel control circuit of a plurality of modules through a 3-wire serial data line dedicated to a corresponding module, and receiving the first serial signal through the serial data receiver to transmit a second serial signal obtained from the first serial signal to one module selected from among the plurality of modules through one line among the 3-wire serial data line.

In still other embodiments of the present invention, serial digital signal transmitting methods for adjusting a multi-channel voltage output, includes:

generating a 20-bit module information serial signal Dt that 4-bit module information is removed from 24-bit information serial signal DT transmitted from a computer or processor;

delaying a one shot-pulse generated in response to the information serial signal DT to generate a clock signal;

generating a reset signal, load signal, and chip selection signal by using a counting output of the clock signal;

extracting selection module information included in the 4-bit module information by using the clock signal, load signal, and reset signal; and transmitting the module information serial signal Dt, and modified signals of the clock signal and chip selection signal only to a module selected according to the selection module information through a dedicated 3-wire serial data line.

Advantageous Effects

According to a configuration of the present invention, a multi-channel voltage output adjustment is performed more efficiently in an environment in which an effect of digital noise is minimized or reduced.

MODE FOR CARRYING OUT THE INVENTION

Figure 1:
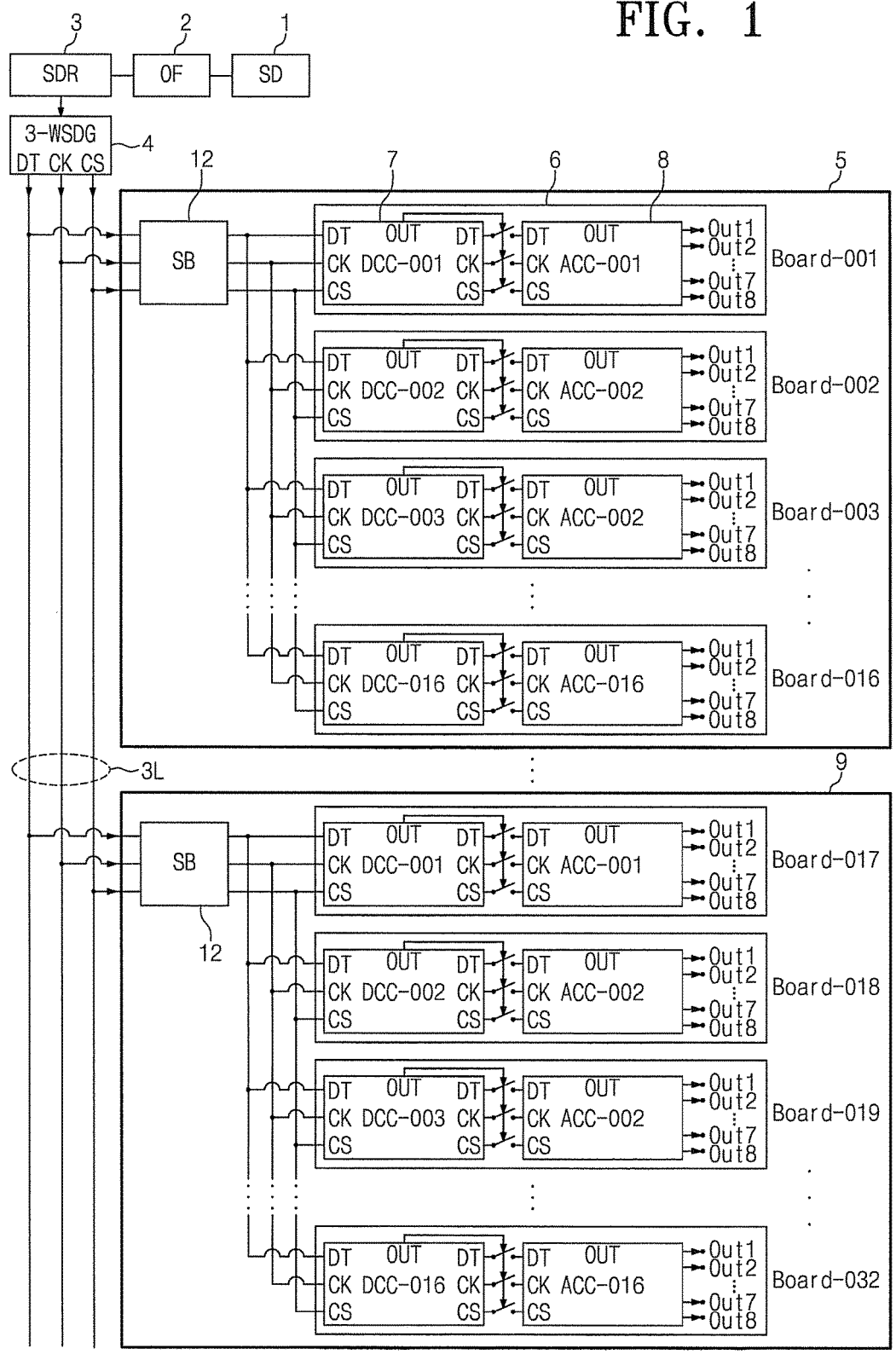
FIG. 1 is a block diagram of a typical digital signal transmitting apparatus for adjusting a multi-channel device.

The foregoing objectives and other objectives, features and advantages of the present invention will become more readily apparent through reviewing the following detailed description and accompanying drawings. However, the present invention is not limited to the following embodiments but embodied in other types. Rather, the embodiments presented here are intended to provide the convenience of understanding, without other intention, so that this disclosure will be thorough and complete, and will fully convey the scope of the present invention to those skilled in the art.

In the present disclosure, if certain devices or lines are described as being connected to a target device block, they are not only directly connected to the target device block, but also connected to the target device block by means of any other device.

Also, the same or similar reference numerals provided in each drawing denote the same or similar components. In some drawings, connection relations between devices and lines are merely shown for an efficient description of the technical spirit, and therefore other devices or circuit blocks may be further provided.

Exemplary embodiments set forth herein may include complementary embodiments thereof, and it will be noted that a general operation of a digital signal transmitting apparatus may be omitted so as not to obscure the essential point of the inventive concept.

Figure 2:
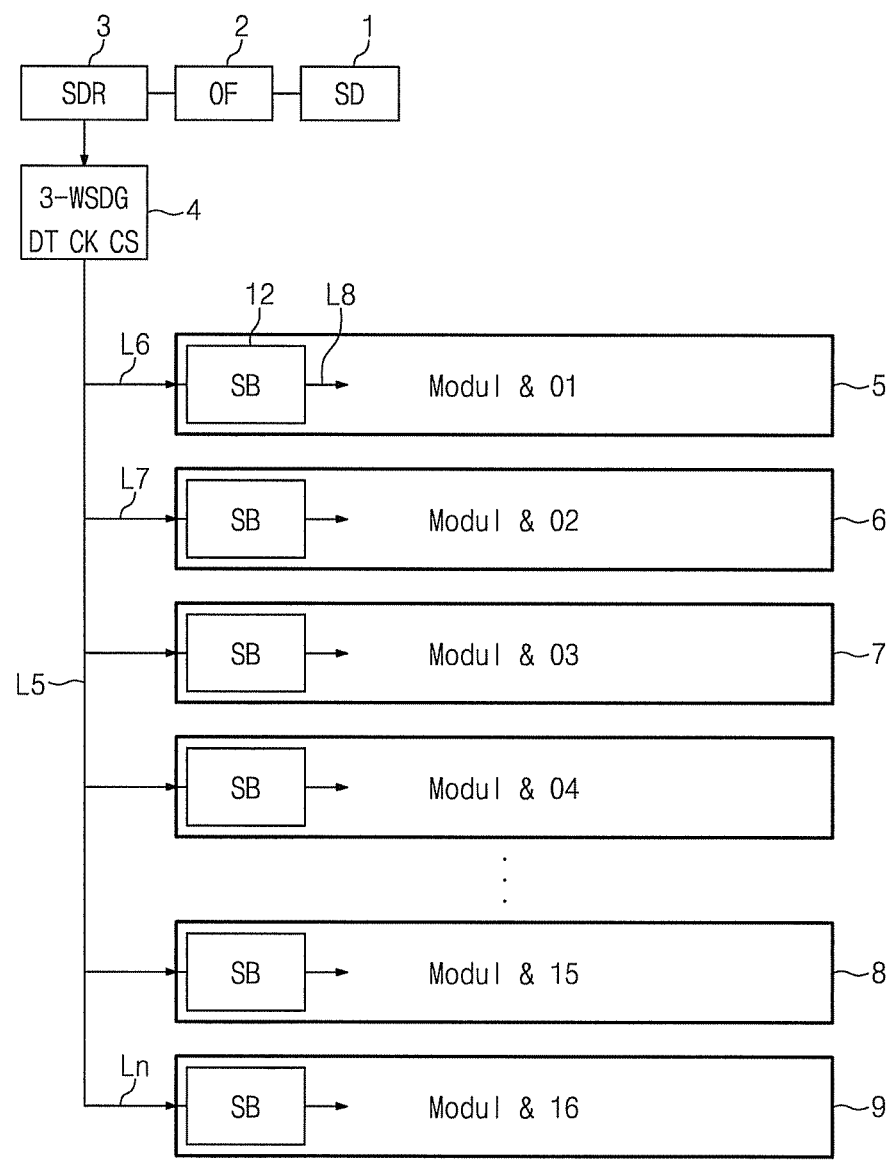
FIG. 2 is a wiring configuration block diagram showing that a module selection voltage output adjusting signal is transmitted to a plurality of modules according to FIG. 1.
Figure 3:
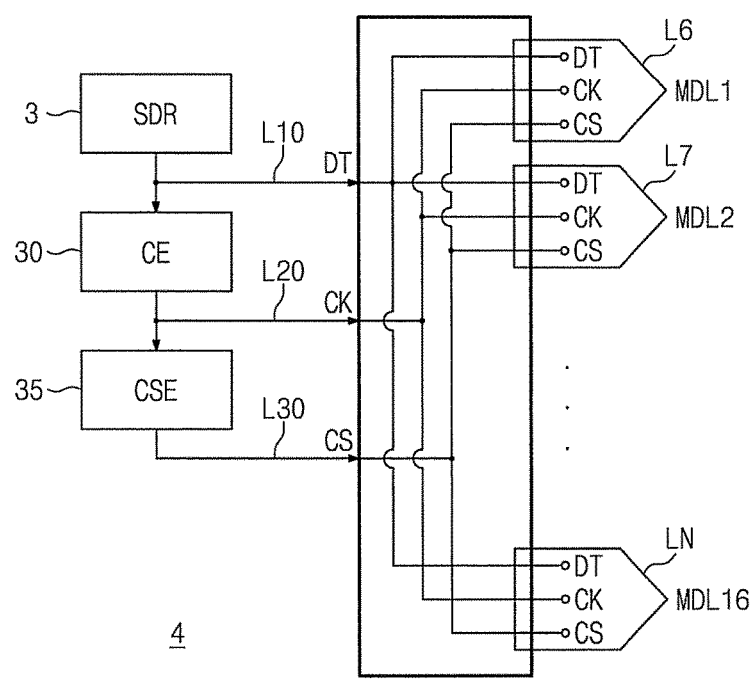
FIG. 3 is a detailed configuration diagram of a 3-wire information serial signal converter according to FIG. 1.
Figure 3:
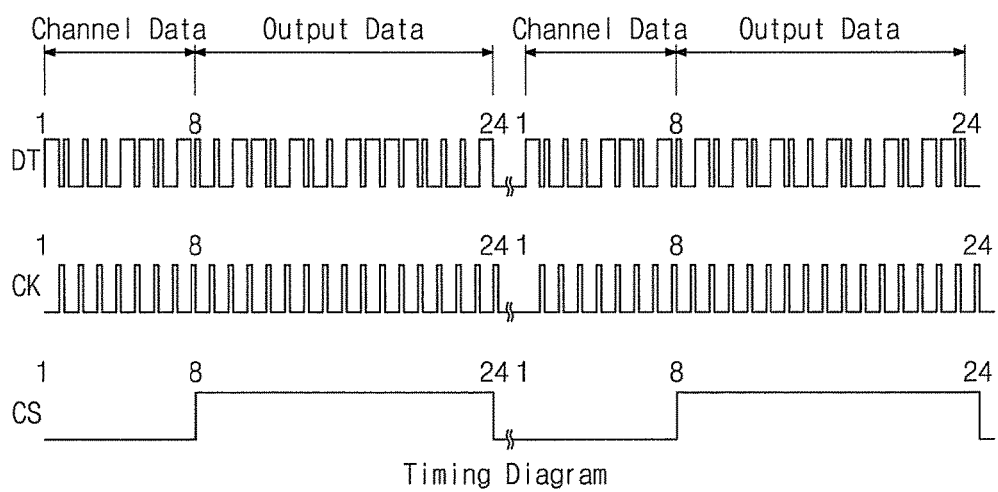

Firstly, a typical technique is intended to provide more thorough understanding, without other intention, for the embodiments of the present invention with reference to FIGS. 1 to 3.

FIG. 1 is a block diagram of a typical digital signal transmitting apparatus for adjusting a multi-channel device.

Referring to FIG. 1, a configuration block of a device is exemplarily shown.

In the drawing, a serial digital signal (hereinafter information serial signal) 1 having adjustment information on a SQUID sensor is made by a computer or the like and applied to a serial receiver 3 passing through an optical cable 2. Here, the information serial signal becomes a channel selection voltage output adjusting signal.

The information serial signal received by the serial receiver 3 of FIG. 1 is applied to a typical 3-wire serial signal converter 4 to be made three kinds of serial signals. Here, the three kinds of serial signals are data (DT), clock (CK), chip selection (CS) signals, respectively. The three digital signals are applied to control circuit modules 5 and 9 configured with a plurality of channels. A channel selector 7 in a channel control circuit 6 included in the control circuit module 5 separates a channel number from the three digital signals DT, CK, and CS received through a signal buffer 12. When the separated channel number is the same as a unique channel number of a SQUID control circuit, the channel selector 7 transmits information included in the information serial signal to a corresponding digital-to-analog converter (DAC) functioning as a voltage control circuit 8. Accordingly, eight independent voltage outputs are made through the DAC. The made analog voltage outputs are transmitted to an analog circuit in the SQUID adjusting circuit to adjust the SQUID sensor.

FIG. 2 shows an entire connection configuration showing transmission of an information serial signal to be applied to modules.

FIG. 2 is a wiring configuration block diagram showing that a module selection voltage adjusting signal is transmitted to a plurality of modules according to FIG. 1.

Referring to FIG. 2, the information serial signal 1 made by a controller such as a computer passes through the optical cable 2 to be provided to the serial receiver 3. The information serial signal output from the serial receiver 3 is applied to 3-wire serial signal converter 4 to be converted to three digital signals DT, CK, and CS. The three digital signals are applied to modules 5 to 9 through transmission lines L5, L6, L7, and Ln. In the drawing, the transmission lines L5, L6, L7, and Ln respectively represent 3-wire serial signals DT, CK, and CS as one line.

The information serial signal includes channel information and output information, and is separated into 3-wire serial signals DT, CK, and CS through the 3-wire serial signal converter 4. Here, a detailed structure of the 3-wire serial signal converter 4 is shown in FIG. 3.

Referring to FIG. 3 showing a detailed configuration of the 3-wire information serial signal converter according to FIG. 1, a converter circuit structure generating the 3-wire information serial signals are shown in more detail.

In FIG. 3, a serial signal applied from the serial receiver 3 is transmitted without change through a line L10 through which the information serial signal DT is transmitted. Furthermore, a clock extraction unit 30 extracts a clock signal CK from the serial signal DT to provide the clock signal CK to a clock signal transmission line L20. In addition, a chip selection signal generator 35 outputs a Low level chip selector signal CS through a line L30 when the channel information is output, and a High level chip selector signal CS through the line L30 when the output information is output.

The 3-wire serial signals DT, CK, and CS generated in FIG. 3 are applied in common to the module 7, 8, and 9 respectively through the corresponding transmission lines L6, L7, and Ln.

In the end, it can be seen that a typical multi-channel voltage output adjusting device has a structure in which the 3-wire serial signals DT, CK, and CS are commonly applied through the transmission line L5 as shown in FIG. 2.

In such a structure, the SQUID sensor is a device sensitive to a magnetic field and easily responds to an external electromagnetic field. In particular, when a spark signal occurring at an edge portion of a digital signal waveform occurs around the SQUID sensor, the SQUID sensor may malfunction due to the spark signal affecting as noise. When the SQUID sensor is exposed to an external spark signal, a measurement operation thereof becomes unstable since the SQUID sensor deviates from an optimal operation state or a flux trap phenomenon occurs. In addition, when some of spark flux flow into the SQUID sensor during measurement, accurate measurement becomes impossible.

A SQUID sensor adjusting circuit includes an analog adjustment output circuit for adjusting the SQUID sensor to detect an output signal, and a digital adjustment circuit for adjusting the analog adjustment output circuit. Since the digital adjustment circuit is connected to an analog circuit and the analog circuit is directly connected to the SQUID sensor, the digital adjustment circuit is positioned at a distance close to the SQUID sensor. Accordingly, a spark noise generated in the digital signal may be easily flowed into the SQUID sensor.

Normally, the multi-channel SQUID system may have 60 or more channels. In this case, although one information serial signal is transmitted from a computer in order to adjust one specific channel, the signal may be received by the digital adjusting circuits of all the channels. Accordingly, the digital signals operate in all the channels to affect the SQUID sensor. At this point, since each sensor is affected by digital noise signals generated in all the channels, as the number of channels increases in a system, each channel SQUID sensor is exposed to more noise effects. Accordingly malfunctions are increased.

In an embodiment of the present invention, the digital noise signal is basically removed which is generated in the digital adjustment circuit of each channel in order to stably adjust the SQUID sensor. In the end, the SQUID sensor stably operates and is adjusted as desired by allowing the SQUID sensor of each channel not to be affected or to be minimized by the digital noise.

Hereinafter embodiments of the present invention will be described.

Figure 4:
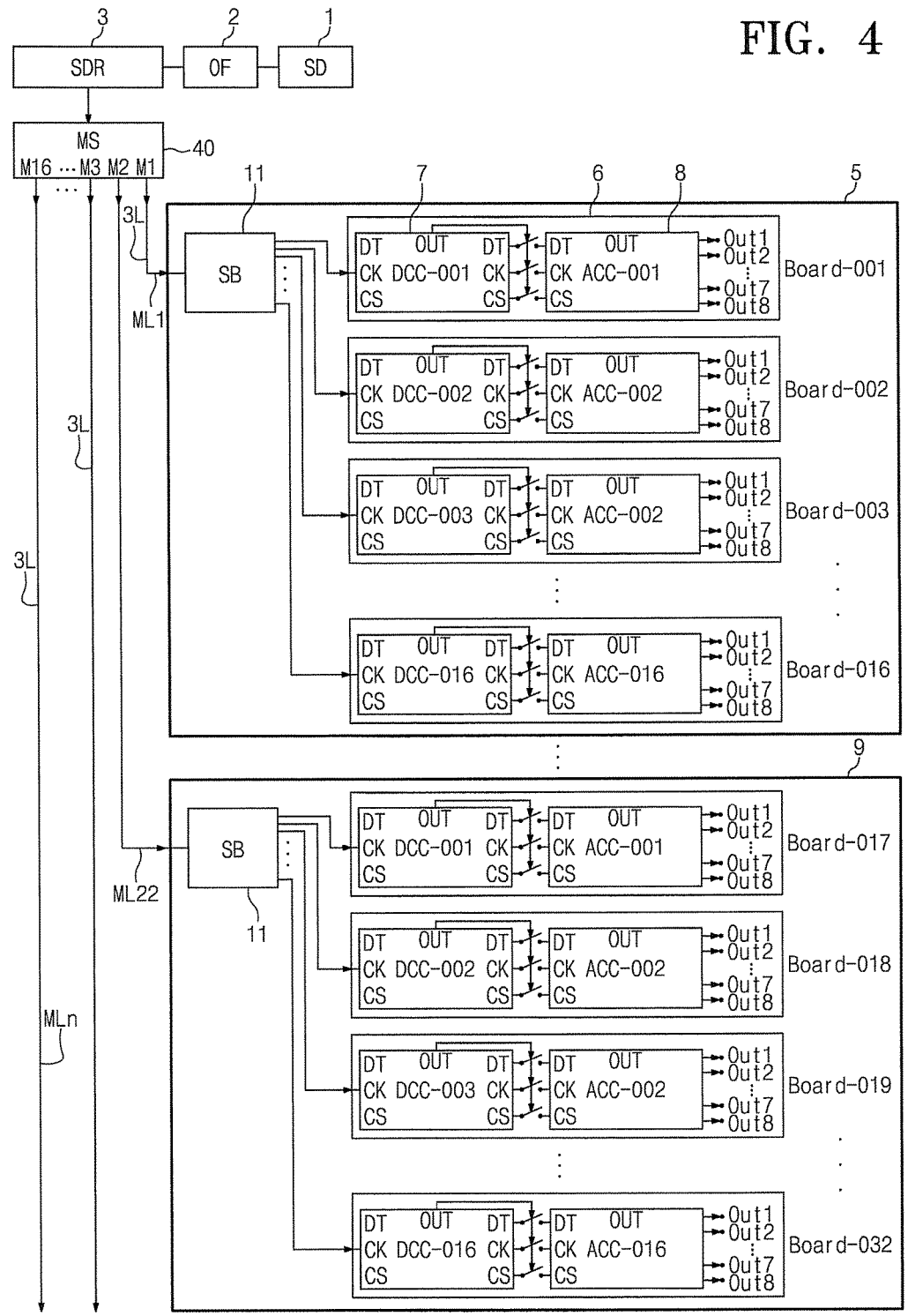
FIG. 4 is block diagram of a digital signal transmitting apparatus for adjusting a multi-channel device according to an embodiment of the present invention.

FIG. 4 is block diagram of a digital signal transmitting apparatus for adjusting a multi-channel device according to an embodiment of the present invention.

FIG. 4 shows a digital signal transmitting apparatus including a serial data receiver 3, and a module selector 40 receiving a first serial signal through the serial data receiver 3 to transmit a second serial signal to one module selected from among a plurality of modules 5 and 9 installed in the apparatus through a 3-wire serial data line ML1 dedicated to a corresponding module.

Each module among the modules includes a plurality of channel control circuits 6 commonly connected through a signal buffer 11. The channel control circuit 6 includes a channel selector 7 and a voltage adjusting circuit 8 providing an adjusted voltage to one output terminal among a plurality of voltage output terminals. Here, the voltage adjusting circuit 8 may include a digital-to-analog converter converting a serial digital input signal into an analog voltage signal.

One module 5 includes 16 channel control circuits 6, each of which is a SQUID control circuit, and the 3-wire information serial signal is transmitted to the selected one module, for example, 5 and then simultaneously applied to 16 SQUID adjusting circuits. Like this, since the 3-wire information serial signal is delivered only to a module including a SQUID adjusting circuit to be adjusted and not delivered to other modules, the digital noise becomes minimized or reduced.

In FIG. 4, the information serial signal made by a computer or a processor is applied to a serial receiver 3 passing through the optical cable 2. The information serial signal output from the serial receiver 3 is converted to 3-wire digital signals Dt, Ck, and Cs by the module selector 40 of the present invention, which performs a 3-wire serial signal converting function, and the converted digital signals are transmitted only to the selected module as a module information serial signal among the plurality of modules.

In FIG. 4, one line represents a wire of the 3-wire serial signals Dt, Ck, and Cs. One module may include 16 SQUID adjusting circuits corresponding to the 16 channels. In that case, for example, the module 5 may adjust channel 1 to channel 16.

The module information serial signal Dt transmitted to the selected module, for example, 5 is simultaneously applied to 16 SQUID adjusting circuits 6. The channel selector 7 that is a SQUID adjusting circuit in the channel control circuit 6 transmits output information related to a sensor operation and adjustment to the voltage adjusting circuit 8 that is an analog adjusting circuit when a channel unique number is compared with a module information serial signal number and the two numbers match.

Furthermore, another module 9 may be responsible from channel 17 to channel 32. When a maximum number of SQUID adjusting channels is 256, the number of the above-described modules may be 16.

In a case of adjusting the SQUID sensor, since a digital signal is simultaneously applied only to 16 digital control circuits belonging to one module, a digital spark noise affecting the SQUID sensor is minimized or dramatically reduced in comparison to a typical technique. Accordingly, it can be seen that stable adjustment is possible during adjusting the SQUID sensor.

Figure 5:
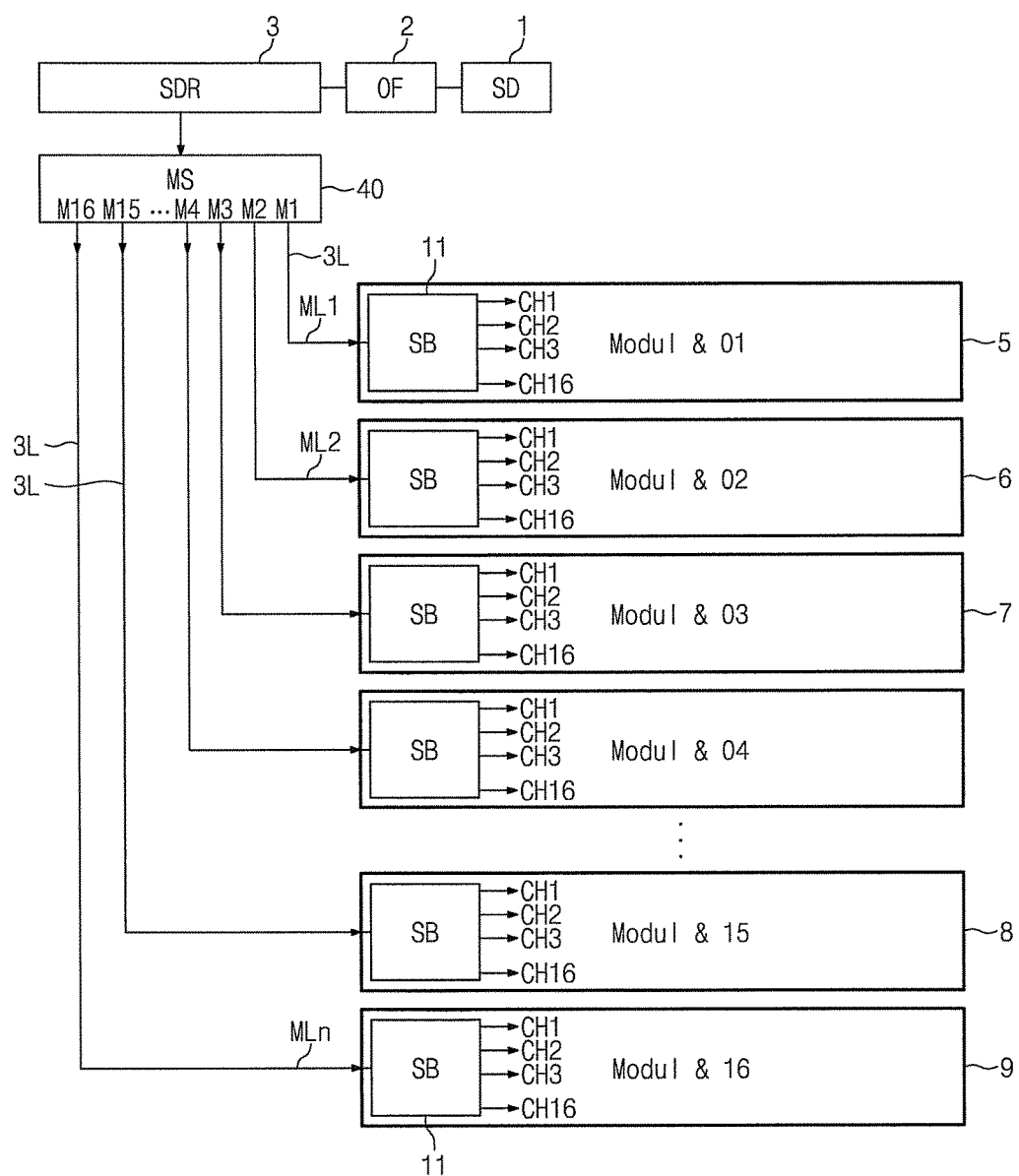
FIG. 5 is a wiring configuration block diagram showing that a module selection voltage output adjusting signal is selectively transmitted to a plurality of modules according to FIG. 4.

FIG. 5 is a wiring configuration block diagram showing that a module selection voltage output adjusting signal is selectively transmitted to a plurality of modules according to FIG. 4.

FIG. 5 exemplarily shows a configuration of the SQUID adjusting circuit for 256 channel SQUID system.

The information serial signal (corresponding to a first serial signal) made by a computer is applied to an optical receiver 3 passing through the optical cable 2. The information serial signal output through the optical receiver 3 is converted to three digital signals Dt, Ck, and Cs by the module selector 40 performing 3-wire serial signal converting function together, and transmitted only to the selected module among the plurality of modules through a dedicated 3-wire serial data line.

In FIG. 5, one line simply represents a wire of the 3-wire serial signals Dt. Ck, and Cs.

Figure 6:
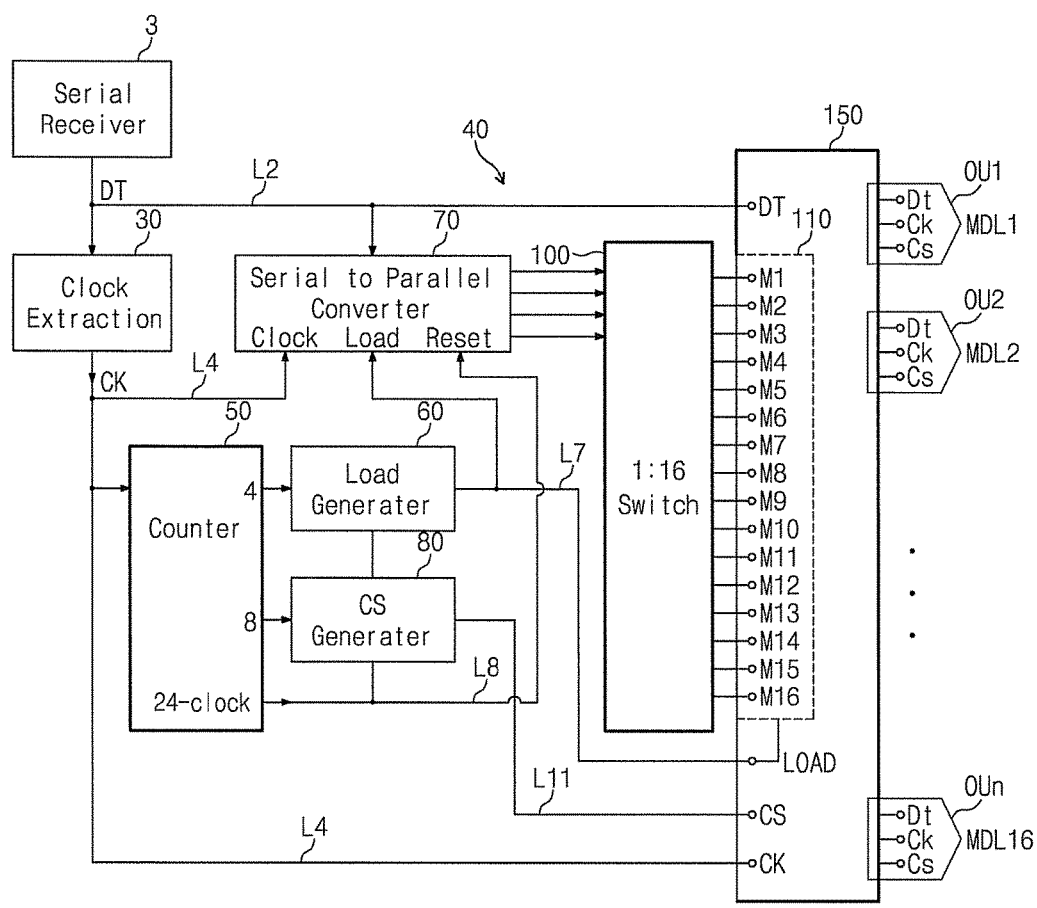
FIG. 6 is an exemplary detailed configuration diagram of the module selector in FIG. 4.
Figure 6:
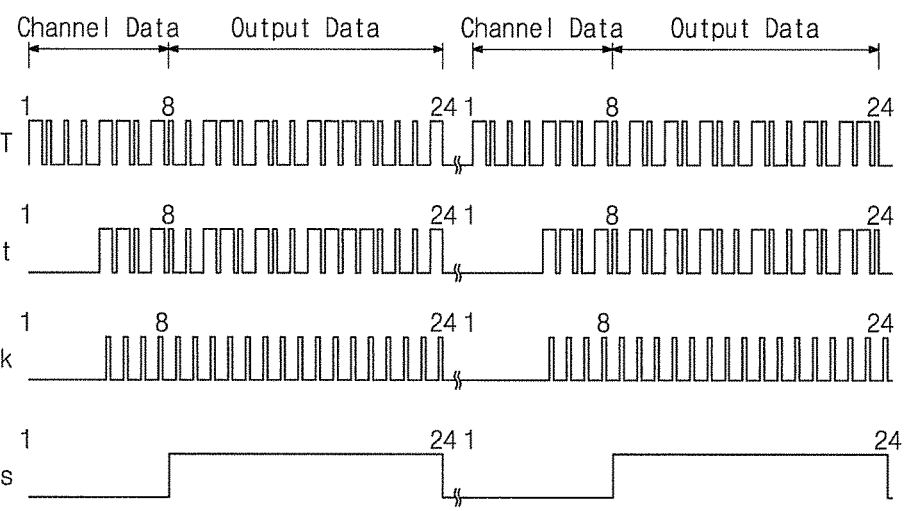

FIG. 6 represents in detail a configuration of the module selector 40 generating a module information serial signal Dt to be applied through one of three wires from the information serial signal DT and selecting a corresponding module according to the SQUID channel.

Figure 7:
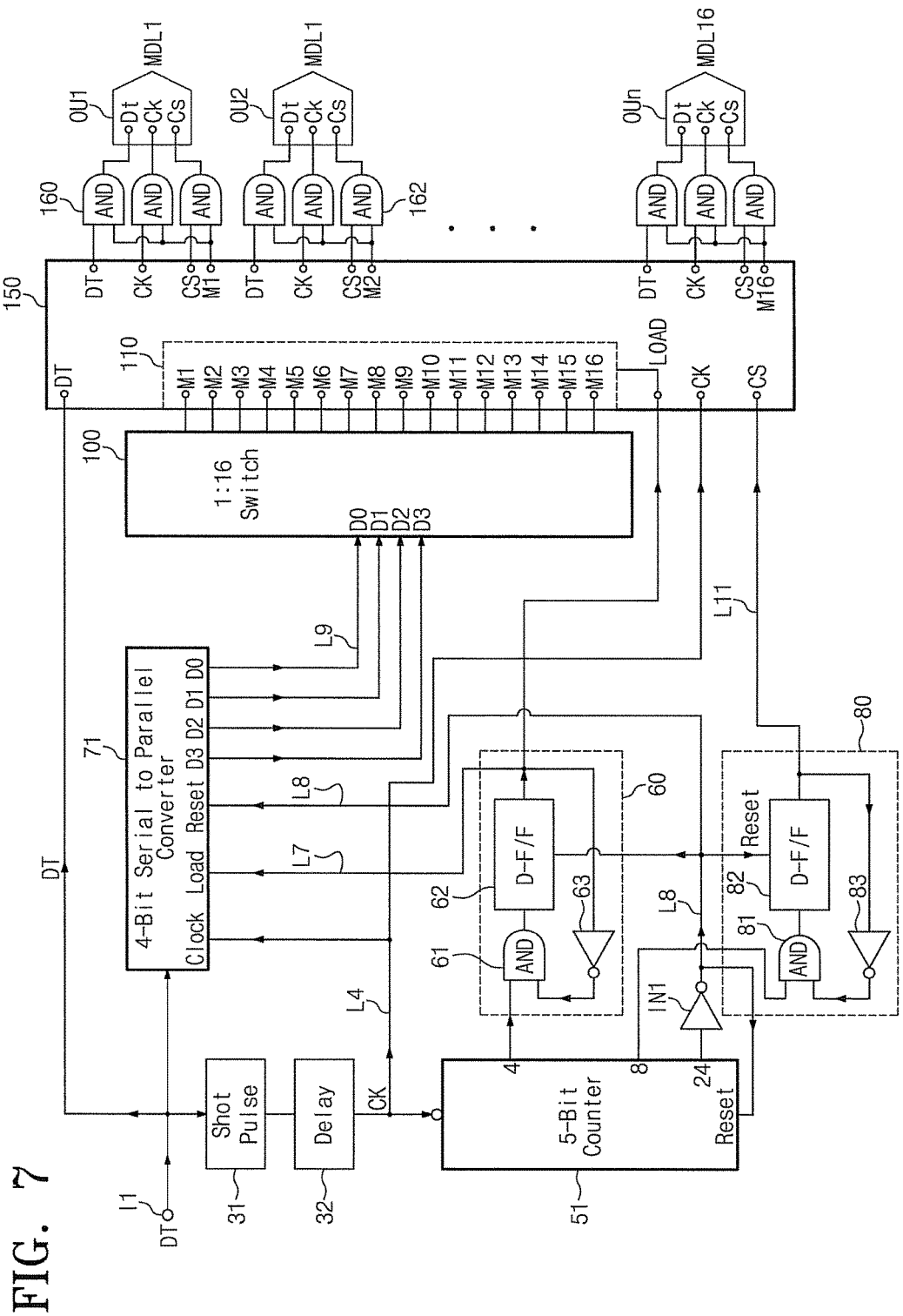
FIG. 7 is an exemplary diagram of detailed implementation of FIG. 6.

FIG. 6 is an exemplary detailed configuration diagram of the module selector in FIG. 4, and FIG. 7 is an exemplary detailed implementation diagram of FIG. 6.

Referring to FIG. 6, the module selector 40 includes:
a clock extraction unit generating a clock signal from the first serial signal;
signal generators 50, 60, and 80 generating a load signal, reset signal, and chip selection signal by using the clock signal;
a serial-to-parallel converter 70 receiving the clock signal, load signal and reset signal to generate parallel module signals for module selection by converting a module information bit included in the first serial signal;
a selection switch 100 determining one module output terminal selected from among the plurality of module output terminals in response to the parallel module signals; and
a data output unit 150 (160 of FIG. 7) transmitting to a module determined by the selection switch the second serial signal that the module information bit is removed from the first serial signal, a modified clock signal of the clock signal, and a modified chip selection signal of the chip selection signal through the 3-wire serial data line.

Referring to FIG. 7, the clock extraction unit 30 of FIG. 6 includes:
a one shot-pulse generator 31 receiving the first serial signal to generate one shot pulse; and
a delay unit 32 delaying the one shot-pulse by a predetermined time to generate the clock signal.

Referring to FIG. 7, the signal generator of FIG. 6 includes:
a counter 51 counting the clock signal to generate the reset signal;
a load signal generator 60 reset by the reset signal and generating the load signal in response to a first counting output among counting outputs of the counter; and
a chip selection signal generator 80 reset by the reset signal and generating the chip selection signal in response to a second counting output among the counting outputs of the counter.

The load signal generator, as shown in FIG. 7, includes:
an AND gate 61 receiving the first counting output of the counter as one input and a feedback signal as the other input to generate an AND response
a flip-flop 62 latching an output of the AND gate until a reset terminal is reset; and
an inverter 63 inverting a logic of a load signal output terminal of the flip-flop to generate the feedback signal.

The serial-to-parallel converter, as shown in FIG. 7, may be
a converter 71 generating the parallel module signals in 4 bits.

The load signal, when generated in relation to FIG. 7, may become a high level signal right after the counter 51 counts a fourth clock signal and a low level signal after a 24th clock signal is counted.

The data output unit, as shown in FIG. 7, may include
a line cross connector 150 connecting the first serial signal, the clock signal, and chip selection signal to a module output terminal selected by the selection switch; and
an AND gating unit 160 gating the first serial signal, clock signal, and chip selection signal as module output information of the selection switch to allow the second serial signal, modified clock signal, and modified chip selection signal to be transmitted through the 3-wire serial data line.

Referring to FIG. 6 again, the information serial signal DT passing through the optical cable and incoming to the serial receiver 3 is applied to the clock extraction unit 30 and to the serial-to-parallel converter 70 at the same time through the transmission line L2.

The clock extraction unit 30 extracts the clock signal CK from the information serial information DT. The counter 50 receiving the clock signal CK through an input terminal outputs respective counting output signals to first to third output terminals. The chip selection signal generator 62 connected to the second and third output terminals of the counter 50 generates the chip selection signal CS synchronized to an 8th and 24th clock signal. The chip selection signal CS is changed to a High level after the 8th clock signal is incoming and changed to a Low level after the 24th clock signal is incoming. The Load signal is changed to a High level after the clock signal CK is clocked fourth times and changed to a Low level after the 24th clock signal is incoming. The Load signal is generated by a Load generator 61 connected to the first output terminal of the counter 50.

When first 4 bits of the information serial signal DT is designed to represent the module information by a designer, a 4-bit Serial-to-Parallel Converter 70 may output a module number to be selected.

When the first 4 serial signals of the information serial signal DT is applied to the 4-bit Serial-to-Parallel Converter 70 in response to the clock CK, a 4-bit parallel module signals are obtained which indicate the module number at the output terminal of the Serial-to-Parallel Converter 70. A serial signal behind a fifth one of the information serial signal DT is transmitted to an output of the module selector 40.

The 4-bit parallel module signals are applied as a module selection signal to a 16 DEMUX or 1:16 switch 100. When the 4-bit parallel module signals are applied, one of 16 module output terminals 110 of the 16 DEMUX or 1:16 switch 100 becomes a High level state. For example, when a first module is selected from among the 16 modules, a first module signal M1 in a High level is connected to an output terminal M1 and DT of an input terminal is connected to an output terminal DT by a connecting function of the line cross connector 150. In addition, CK and CS of the input terminals are respectively connected to CK and CS of the output terminal. Dt, Ck, and Cs signals are output from a first output terminal OU1 of the module selector 40 by an operation of the AND gating unit 160 (shown in FIG. 7) and in the foregoing case, the signals are transmitted only to the first module 5.

Waveforms of the signals Dt, Ck, and Cs transmitted to a selected corresponding module is represented in comparison to DT in FIG. 6.

The information serial signal DT is modified to the module information serial signal Dt through the module selector 40 and the Dt is a signal that first 4-bit information is removed from the DT. In addition, the clock signal CK is modified to Ck that is a signal that corresponding first four clock signals are removed for extracting the module number. In addition, the chip selection signal CS is modified to Cs that is a signal that corresponding first 4-bit signal is removed for extracting the module number. However, in case of Cs, since represented as a Low level in original channel information serial signal, CS becomes Cs without level state change.

The information serial signal Dt transmitted to the selected module may become a type of 20 bit serial signal that 4-bit channel information necessary for distinguishing 16 SQUID channels from each other and 16-bit output information for adjusting a corresponding channel are combined. In other words, the 4-bit channel information functions as a signal for selecting one of 16 SQUID adjustment circuits.

An exemplary implementation circuit of the module selector 40 is shown in FIG. 7.

Referring to FIG. 7 shown as a detailed exemplary implementation diagram of FIG. 6, the information serial signal DT received at an input terminal 11 through the serial receiver is applied to a one shot-pulse generator 31. The delay unit 32 generates a clock signal CK by delaying the one shot-pulse generated in the one shot-pulse generator 31 by a predetermined time.

Here, a pulse width of the one shot-pulse may be determined as a minimum time width during which a digital apparatus will respond.

A delay time of the delay unit 32 may be set as a time longer than a pulse width of a Low level and shorter than a pulse width of a High level in order that a High-level information serial signal and a Low level information serial signal are distinguished from each other.

The clock signal CK is generated late by the delay time of the delay unit than start time of each digital signal of the information serial signal. The 5-bit counter 51 receives the clock signal from an input terminal to generate a High level counting output to a first, second, and third output terminal. A fourth counted output of the clock signal appears at the first output terminal, and an eighth counted output of the clock signal appears at the second output terminal. A 24th counted output of the clock signal appears at the third output terminal.

The Load signal generator 60 connected to the first output terminal of the counter 51 includes an AND gate 61, a D-F/F or T-F/F 62, and a NOT gate (or inverter) 63.

Until the counter 51 counts a third clock signal, an output of the D-F/F 61 is in a Low level, an output of the NOT gate 63 is in a High level, and accordingly an output of the AND gate 61 is in a Low level. When the counter 51 counts a fourth clock signal, a counting output of the first output terminal becomes a High level. Accordingly, an output of the AND gate 61 become a High level. When the output of the AND gate 61 becomes a High level, an output the D-F/F or T-F/F 62 is changed to a High level. In the end, the Load signal appearing on a line L7 is output in a High level. At this point, an output of the NOT gate 63 is changed to a Low level. Accordingly, the output of the AND gate 61 becomes a Low level. However, until the D-F/F 62 is reset, the Load signal is kept in a High level by a latch function of the D-F/F 62. In the end, when the 24th clock signal is counted, the D-F/F 62 is reset and outputs a Low level as an output signal but keeps the Load signal in a High level state until it is reset.

Furthermore, the CS signal generator 80 connected to the second output terminal of the counter 51 includes an AND gate 81, a D-F/F or T-F/F 82, and a NOT gate 83. An operation of the CS signal generator 80 is the same as that of the Load generator 60. An output of the D-F/F or T-F/F 82 is changed from the eighth clock signal to a High level. In the end, the output becomes the chip selection signal CS. When the 24th clock signal is counted, the CS signal generator 80 is also reset.

When counting the 24th clock signal, the 5-bit counter 51 generates the reset signal through the inverter connected to a third output terminal. The counter itself is reset by the reset signal and allows the Load and CS signals to be reset to a Low level.

In the end, a module to which a signal is transmitted is selected by the 4-bit Serial-to-Parallel Converter 71 and 16-bit DEMUX or 1:16 switch 100 in the module selector 40, and the module information serial signal Dt is transmitted to only to a selected module from among the plurality of modules through the line cross connector 150 and AND gating unit 160.

The information serial signal DT and the clock signal CK are respectively applied to an input terminal IN and a clock terminal CK1 of the 4-bit Serial-to-Parallel Converter 71. When first 4 bits of the information serial signal DT is input according to four clock signals, 4-bit parallel signals are output to an output of the 4-bit Serial-to-Parallel Converter 71 by an operation of the Load signal. The 4-bit Serial-to-Parallel Converter 71 converts first four bit signal among 24 bits of the information serial signal DT into parallel signals in response to the Load signal. In addition, the 4-bit Serial-to-Parallel Converter 71 remains without response while a remaining 20-bit signal is incoming and is reset after the 24-bit signal of the information serial signal DT passes. The 4-bit parallel signals indicating the module number to be selected is generated after the first four bits of the information serial signal DT incomes, and disabled when the 24-bit signal passes.

In the end, after reset by the reset signal, the 4-bit Serial-to-Parallel Converter 71 allows another module to be selected by generating a 4-bit parallel module signals in response to the next applied information serial signal DT.

In FIG. 7, the 4-bit parallel module signals are applied as a module selection signal to the 16 DEMUX or 1:16 switch 100. When the 4-bit parallel module signals are applied, one of 16 module output terminals 110 of the 16 DEMUX or 1:16 switch 100 becomes a High level state. In the end, a module connected to the output terminal that becomes a High level is to be selected as a module for transmitting a signal.

For example, when a first module 5 is selected from among the 16 modules, a first module signal M1 in a High level is connected to an output terminal M1 and DT of an input terminal is connected to an output terminal DT by a connecting function of the line cross connector 150. In addition, CK and CS of the input terminals are respectively connected to CK and CS of the output terminals. Dt, Ck, and Cs signals are output from the first output terminal OU1 of the module selector 40 by an operation of the AND gating unit 160 and the signals are transmitted only to the first module 5 of FIG. 4.

In addition, for example, when a last module is selected from among the 16 modules, a 16th module signal M16 in a High level is connected to an output terminal M16 and DT of an input terminal of the line cross connector 150 is connected to an output terminal DT by a connecting function of the line cross connector 150. In addition, CK and CS of the input terminals are respectively connected to CK and CS of the output terminals. Dt, Ck, and Cs signals are output from a 16th output terminal OUn of the module selector 40 by an operation of the AND gating unit for the 16th module and the signals are transmitted only to the 16th module.

The above-described embodiment of the invention may be used when the SQUID sensor relatively sensitive to noise generated in the digital signal is adjusted, and may be applied to a 64 channel-Magnetocardiograph (MCG) system and a 160 channel-Magnetoencepharograph (MEG) system. The MCG system forms 4 modules and the MEG system forms 10 modules by forming 16 channels as a unit module. In a case where embodiments of the present invention are applied, digital noise generated when each channel is adjusted may be dramatically reduced.

Such as this, it can be seen that a voltage is output which is adjusted at an output terminal of a corresponding channel in a module selected according to information included in an information serial signal DT transmitted from a computer, or the like. The 24-bit information serial signal DT is changed to a 20-bit module information serial signal Dt through a module selector. The 20-bit module information serial signal Dt is transmitted only to a selected module from among the plurality of modules through a dedicated 3-wire line.

The 20-bit module information serial signal Dt transmitted to the selected module may be changed to a 16-bit channel information serial signal dt through the channel selector 7. The channel information serial signal dt transmittable only to the selected channel generates an adjusted voltage at one of the 8 output terminals.

Furthermore, in a case where a channel is extended, or an output terminal and output voltage are extended or changed at a final output terminal, the channel information bit and output information bit may be changed in information of the information serial signal DT output from the computer. In addition, a circuit configuration of the module selector or channel control circuit may be changed accordingly.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description. For example, a circuit configuration or schema of serial signal transmission can be changed or modified in a variety forms without departing from the technical idea of the present invention in other cases.

The invention claimed is:

1. A digital signal transmitting apparatus comprising:
a serial data receiver configured to receive a first serial signal including a clock signal and module information;
a plurality of modules;
a clock extraction unit configured to extract a clock signal from the first serial signal;
a module selector receiving the first serial signal through the serial data receiver, multiplexing a portion of the first serial signal based on the extracted clock signal, selecting one module of the plurality of modules based on the multiplexed portion of the first serial signal, and removing the module information; and
a data output unit transmitting a second serial signal indicating that the module information is removed to the one module selected from among the plurality of modules through a 3-wire serial data line dedicated to a corresponding module with the extracted clock signal,
wherein the first serial signal is generated by a computer and applied to the serial data receiver through an optical cable,
wherein the first serial signal comprises module information bits of a set number of bits,
wherein the second serial signal is a serial digital signal that the module information bits are removed,
wherein when the apparatus adjusts 160 channels or more, the first and second serial signals are respectively a 24-bit information serial signal and a 20-bit module information serial signal,
wherein the module selector comprises:
a clock extraction unit generating a clock signal from the first serial signal;
a signal generator generating a load signal, reset signal, and chip selection signal by using the clock signal;
a serial-to-parallel converter receiving the clock signal, load signal and reset signal to generate parallel module signals for module selection by converting the module information bits comprised in the first serial signal;
a selection switch determining one module output terminal selected from among the plurality of module output terminals in response to the parallel module signals; and
a data output unit transmitting to a module determined by the selection switch the second serial signal that the module information bits are removed from the first serial signal, a modified clock signal of the clock signal, and a modified chip selection signal of the chip selection signal through the 3-wire serial data line, wherein the signal generator comprises:
 a counter counting the clock signal to generate the reset signal;
 a load signal generator reset by the reset signal and generating the load signal in response to a first counting output among counting outputs of the counter; and
 a chip selection signal generator reset by the reset signal and generating the chip selection signal in response to a second counting output among the counting outputs of the counter,
wherein the load signal generator comprises:
 an AND gate receiving the first counting output of the counter as one side input and a feedback signal as another side input to generate an AND response;
 a flip-flop latching an output of the AND gate until a reset terminal is reset; and
 an inverter inverting a logic of the load signal output terminal of the flip-flop to generate the feedback signal.

2. The digital signal transmitting apparatus of claim 1, wherein the clock extraction unit comprises:
 a one shot-pulse generator receiving the first serial signal to generate a one shot-pulse; and
 a time delay unit delaying the one shot-pulse by a predetermined time to generate the clock signal.

3. The digital signal transmitting apparatus of claim 1, wherein the serial-to-parallel converter is a converter generating the parallel module signals in 4 bits.

4. The digital signal transmitting apparatus of claim 3, wherein the load signal becomes a high level signal right after the counter counts a fourth clock signal and a low level signal after the counter counts a 24th clock signal.

5. The digital signal transmitting apparatus of claim 2, wherein the selection switch is a 1:16 demultiplexer generating a high level signal at one of 16 output terminals in response to the parallel module signals.

6. The digital signal transmitting apparatus of claim 2, wherein the data output unit comprises:
 a line cross connector connecting the first serial signal and chip selection signal to an output terminal of a module selected by the selection switch; and
 an AND gating unit gating the first serial signal, clock signal, and chip selection signal as module output information of the selection switch to allow the second serial signal, modified clock signal, and modified chip selection signal to be transmitted through the 3-wire serial data line.

7. A digital signal transmitting apparatus suitable for being employed in a Magnetoencephalography system having a plurality of channels, the digital signal transmitting apparatus comprising:
 a serial data receiver receiving a first serial signal applied from a control computer, wherein the first serial signal includes a clock signal and module information;
 a clock extraction unit extracting the clock signal from the first serial signal;
 a module selector connected to the serial data receiver through a signal line, connected to a channel control circuit of a plurality of modules through a 3-wire serial data line dedicated to a corresponding module, and receiving the first serial signal through the serial data receiver, and multiplexing a portion of the first serial signal based on the extracted clock signal, selecting one module of the plurality of modules based on the multiplexed portion of first serial signal, and removing the module information; and
 a data output unit configured to transmit a second serial signal obtained from the portion of the first serial signal indicating that the module information is removed to the one module selected from among the plurality of modules through one line among the 3-wire serial data line with the extracted clock signal, and
wherein a number of channel control circuits installed in the plurality of modules is identical to that of channels.

8. The digital signal transmitting apparatus of claim 7, wherein when a voltage adjusting circuit in the channel control circuit is configured with a digital-to-analog converter, a control of the voltage adjusting circuit is performed by a digital control circuit.

9. A method comprising:
 receiving, through a serial receiver, an information serial signal DT transmitted through an optical fiber from a computer, wherein the first serial signal includes a clock signal and module information;
 extracting the clock signal and chip selection signal by using the information serial signal DT;
 removing module information from the information serial signal DT;
 multiplexing a portion of the information serial signal based on the extracted clock signal;
 selecting one module of a plurality of modules based on the multiplexed portion of the information serial signal; and
 independently transmitting the generated clock signal and chip selection signal to the one module selected from among the plurality of modules indicating that the module information is removed through a 3-wire serial data line dedicated to a corresponding module with the extracted clock signal.

10. A serial digital signal transmitting method for adjusting a multi-channel voltage output, the serial digital signal transmitting method comprising:
 generating a 20-bit module information serial signal Dt that 4-bit module information is removed from 24-bit information serial signal DT transmitted from a computer or processor, wherein the information serial signal includes a clock signal and module information;
 delaying a one shot-pulse generated in response to the information serial signal DT to generate a clock signal;
 generating a reset signal, load signal, and chip selection signal by using a counting output of the clock signal;
 extracting the clock signal from the information serial signal;
 extracting selection module information comprised in the 4-bit module information by using the clock signal, load signal, and reset signal;
 multiplexing a portion of the information serial signal based on the extracted clock signal;
 selecting one module of the plurality of modules based on the multiplexed portion of the information serial signal; and
 transmitting the module information serial signal Dt, and modified signals of the clock signal and chip selection signal indicating that the module information is removed to the one module selected according to the selection module information through a dedicated 3-wire serial data line with the extracted clock signal.

* * * * *